United States Patent
Rodriguez et al.

[19]

[11] Patent Number: 6,069,512

[45] Date of Patent: May 30, 2000

[54] DYNAMIC CIRCUITS AND STATIC LATCHES WITH LOW POWER DISSIPATION

[75] Inventors: Pablo Martin Rodriguez, Burlingame; Kent R. Townley, Campbell, both of Calif.

[73] Assignee: Intel Corporation

[21] Appl. No.: 08/997,768

[22] Filed: Dec. 24, 1997

[51] Int. Cl.[7] .................................................. H03K 3/356
[52] U.S. Cl. ........................................... 327/200; 327/208
[58] Field of Search ..................................... 327/200, 203, 327/208–210, 214, 218; 326/98

[56] References Cited

U.S. PATENT DOCUMENTS

| | | | |
|---|---|---|---|
| 4,578,600 | 3/1986 | Magee | 326/83 |
| 4,791,321 | 12/1988 | Tanaka et al. | 326/27 |
| 5,371,420 | 12/1994 | Nakao | 327/384 |

FOREIGN PATENT DOCUMENTS 567716  11/1993  European Pat. Off. ............... 327/218

OTHER PUBLICATIONS

"Field Effect Transistor" by Neudeck et la., pp. 119–120, 130–134, 1990.

*Primary Examiner*—Tuan T. Lam
*Attorney, Agent, or Firm*—Seth Z. Kalson

[57] ABSTRACT

A half latch for latching a voltage at a domino gate output with reduced crossbar current duty cycle, comprising a CMOS inverter with input connected to the domino gate output, a first pMOSFET having a gate and drain connected to ground and having a source coupled to the source of the nMOSFET of the CMOS inverter to prevent the source voltage of the nMOSFET from approaching ground, and a second pMOSFET having a gate connected to the output of the CMOS inverter and having a drain connected to the input of the CMOS inverter.

4 Claims, 3 Drawing Sheets

DYNAMIC CIRCUITS AND STATIC LATCHES WITH LOW POWER DISSIPATION

FIELD OF INVENTION

This invention relates to switching circuits, and more particularly to dynamic switching circuits with low power dissipation.

BACKGROUND

Crossbar current is an undesirable effect occurring in dynamic switching circuits because it contributes to power dissipation. Crossbar current can be present, for example, in the combination of a latch circuit coupled to a dynamic logic gate. To illustrate this, consider circuit 100 in FIG. 1, showing half latch (or half keeper) 110 coupled to domino gate 120. In this example, domino gate 120 is a simple inverter where IN is the input signal applied to nMOSFET 130 (n-metal oxide semiconductor field effect transistor), φ is the clock signal applied to pMOSFET 140 and nMOSFET 150, and OUT is the output signal captured, or latched, by half latch 110. Clock signal φ cycles through two phases, which we shall refer to as precharge and evaluation phases as shown in FIG. 1.

Ignoring any initialization procedure, the OUT signal will be HIGH and pMOSFET 160 will be ON when clock signal φ is in its precharge phase and the OUT signal will be the complement of IN when clock signal φ is in its evaluation phase. Half latch 110 provides a half keeper, or half latch, function to OUT. During a precharge phase, pMOSFET 140 brings OUT to HIGH and forces pMOSFET 160 ON if not already ON. If in the subsequent evaluation phase IN happens to be LOW, then half latch 110 keeps, or latches, OUT HIGH throughout this evaluation phase so that OUT is properly the logical complement of IN.

Crossbar current arises as follows. If IN is HIGH, then OUT will transition from HIGH to LOW and pMOSFET 160 will switch from ON to OFF when clock signal φ transitions from its precharge phase to its evaluation phase. However, because pMOSFET 160 does not turn OFF instantaneously, there will be crossbar current flowing through transistor 160 and domino gate 120 when OUT transitions from HIGH to LOW and pMOSFET 160 switches from ON to OFF.

It is therefore desirable to reduce the crossbar current duty cycle in dynamic the switching circuits so as to reduce unwanted power dissipation and to increase switching rate.

DETAILED DESCRIPTION OF EMBODIMENTS

Figure 1:
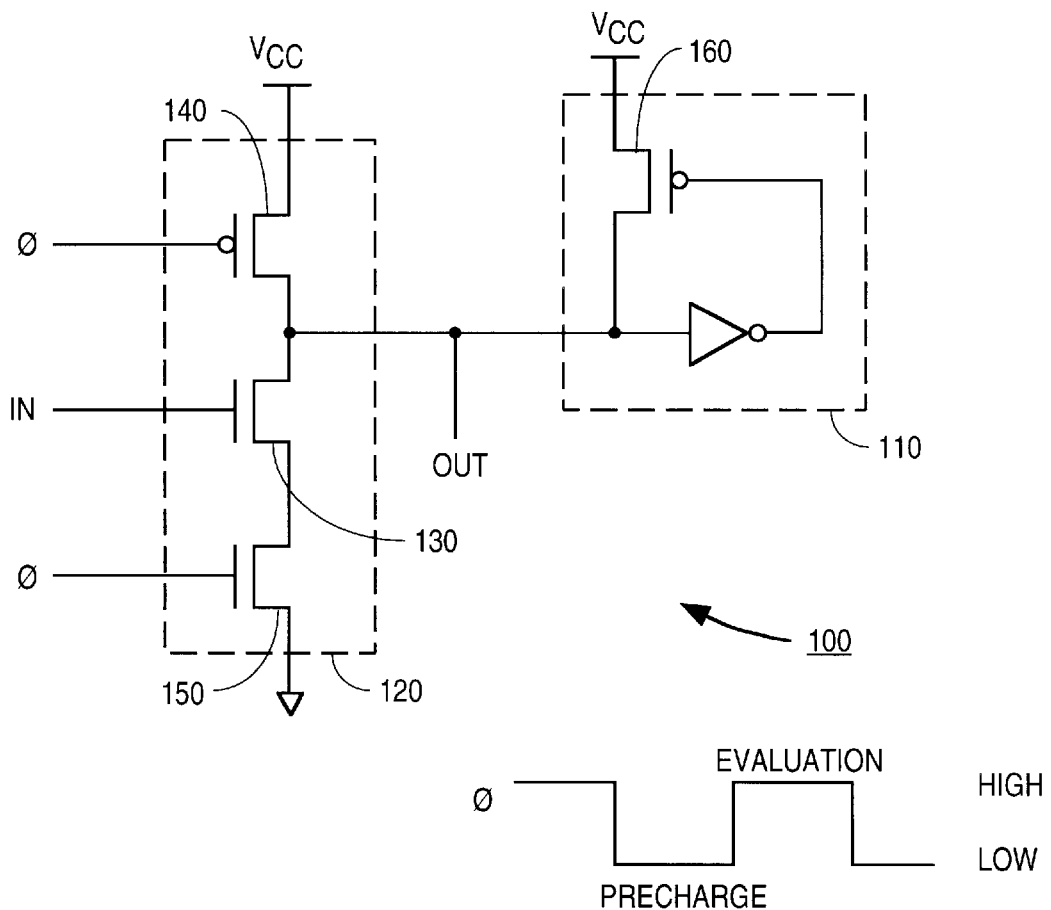
FIG. 1 illustrates a prior art half latch connected to a domino inverter.
Figure 2:
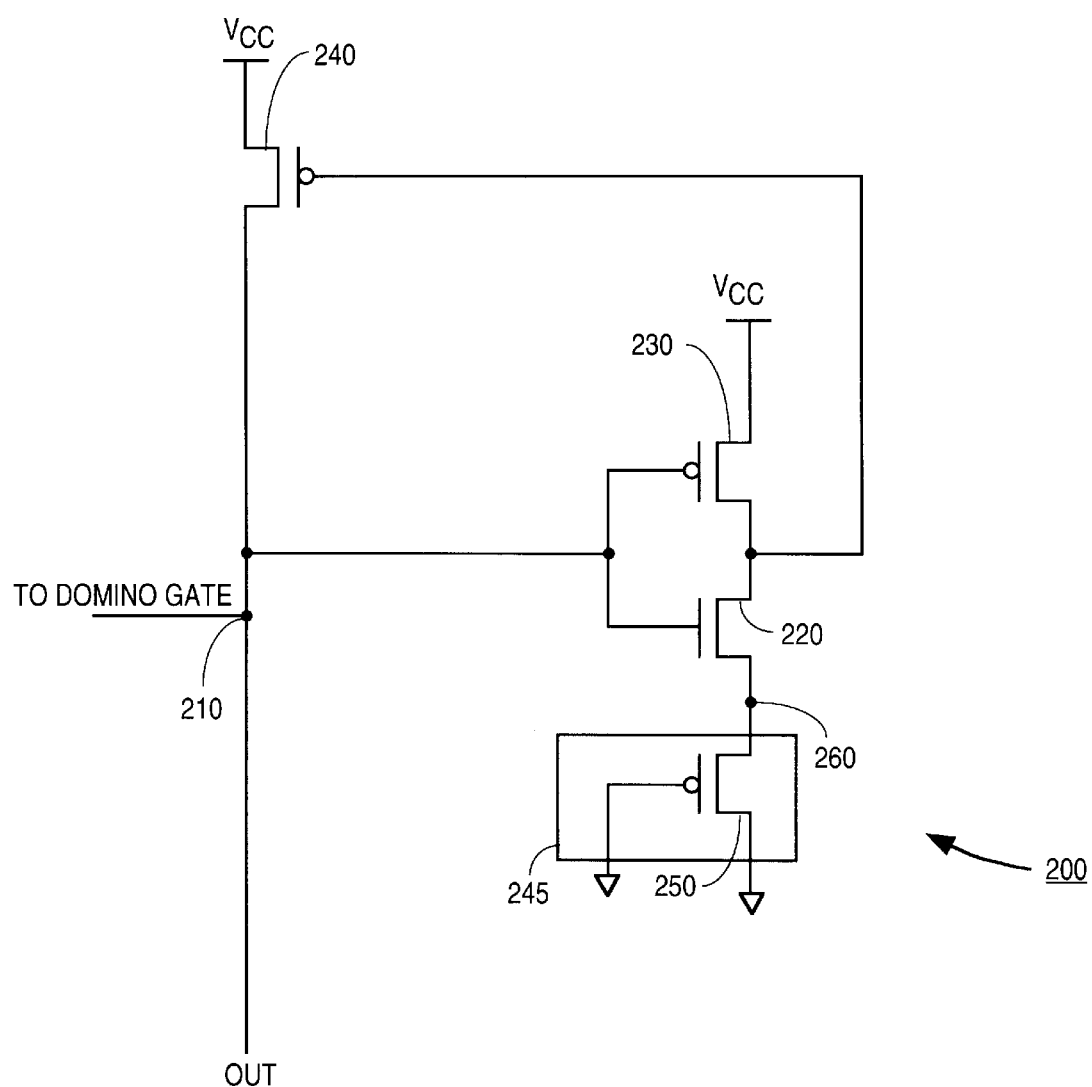
FIG. 2 illustrates a half latch with reduced power dissipation.

Circuit 200 in FIG. 2 illustrates an embodiment. Not shown is a domino gate, which is coupled to node 210. Transistors pMOSFET 230 and nMOSFET 220 constitute a CMOS (complementary metal oxide semiconductor) inverter, and together with pullup pMOSFET 240 latch the voltage at node 210 when it is HIGH. Coupled to nMOSFET 220 is bias circuit 245. In the particular embodiment shown, bias circuit 245 is connected to the source of nMOSFET 220 at node 260. However, in other embodiments, bias circuit 245 may be connected to the substrate of nMOSFET 220 only, or to both the source and substrate of nMOSFET 220. Bias circuit 245 raises the threshold voltage of nMOSFET 220 relative to the situation in which the source and substrate of nMOSFET 220 are grounded. This can be accomplished by biasing the source and or substrate of nMOSFFT 220 so that the depletion layer of nMOSFET 220 is increased.

In the particular embodiment illustrated in FIG. 2, bias circuit 245 comprises pMOSFET 250 having its drain grounded, its gate grounded, and its source connected to the source of nMOSFET 220. Transistor pMOSFET 250 will be ON provided its gate voltage is less than its source voltage by an amount greater than its threshold voltage $V_{th}$. Therefore, the voltage at node 260, which is the source voltage of pMOSFET 250 and nMOSFET 220, is prevented from falling to ground because pMOSFET 250 will start to turn OFF as the voltage at node 260 drops to the threshold voltage. Equivalently, node 260 is kept at some voltage above ground which we denote as $V_{be}$ for "body effect" voltage. In one particular embodiment, it is found through simulation that $V_{be}$ oscillates between 0.4 and 0.6 volts for a technology that has $V_{cc}$=1.6 Volts and $V_{th}$=0.4 Volts.

Keeping node 260 at a voltage above ground increases the threshold voltage of nMOSFET 220 when compared to the case in which the source of nMOSFET 220 is grounded. With the substrate of nMOSFET 220 at ground potential but its source above ground potential, the depletion region within nMOSFET 220 is increased, which increases its threshold voltage. For circuit 200 of FIG. 2, the increase in the threshold voltage of nMOSFET 220 is due to the coupling of the source of nMOSFET 220 to the source of pMOSFET 250 in which the gate and drain of pMOSFET 250 are grounded.

With bias circuit 245 biasing the source of nMOSFET 220, the duty cycle of crossbar current flowing through pMOSFET 240 and into the domino gate is reduced, as is now described. Consider the case in which the node 210 voltage is HIGH, so that nMOSFET 220 is ON, pMOSFET 230 is OFF, and pMOSFET 240 is ON. This case will occur when the clock signal driving the domino gate is in its precharge phase. Now, suppose that during the clock signal's evaluation phase, node 210 is brought toward LOW due to the domino gate. The voltage at node 210 need only fall to $V_{th}(\text{bias})+V_{be}$ to cause nMOSFET 220 to switch OFF, where $V_{th}(\text{bias})$ is the threshold voltage of nMOSFET 220 when its source is biased to voltage $V_{be}$ with respect to its substrate. Since $V_{th}(\text{bias})+V_{be}>V_{th}$, this event takes less time than for the case in which the voltage at node 210 must fall to $V_{th}$ before nMOSFET 220 begins to turn OFF, where $V_{th}$ is the threshold voltage of nMOSFET 220 without biasing.

With nMOSFET 220 switching OFF faster, the voltage at the gate of pMOSFET 240 is brought to HIGH faster, which causes pMOSFET 240 to switch OFF faster, which in turn reduces the length of time in which crossbar current is flowing through pMOSFET 240 and into the domino gate. Thus, circuit 200 results in a smaller duty cycle for the crossbar current than for the case in which the source of nMOSFET 220 is grounded. Consequently, less power is dissipated. Furthermore, because pMOSFET 240 switches OFF faster, the domino gate coupled to node 210 "fights" less with half-latch circuit to bring the Node 210 LOW, i.e., there is less contention. Consequently, the maximum switching rate of circuit 200 is increased because of bias circuit 245.

We also see that raising the threshold voltage of nMOSFET 220 has the effect of raising the voltage level of node 210 which is "interpreted" as LOW by CMOS inverter 220 and 230. More precisely, there will be a set of voltages, A, within the domino gate which is considered a logic level LOW so that nMOSFETs within the domino gate will switch OFF for any gate voltage within this set. The presence of bias circuit 245 will be such that there exists a voltage level at node 210 representing a LOW logic level to CMOS inverter 220 and 230 and which is greater than the least upper bound (supremum) of the set A, provided the threshold voltages of the nMOSFETs within the domino gate have not been changed.

Another advantage of circuit 200 is that when nMOSFET 220 is ON, the gate voltage of pMOSFET 240 cannot be less than $V_{be}$, and consequently pMOSFET 240 can switch OFF faster than when its gate voltage is at ground. This aids in reducing the duty cycle of the crossbar current.

An essential feature of circuit 200 is that the threshold voltage of nMOSFET 220 is raised by pMOSFET 250 as connected in FIG. 2. However, other embodiments for raising the threshold voltage of nMOSFET 220 may be realized. Bias circuit 245 may comprise other circuits or devices. For example, a diode may be coupled between node 260 and ground so that the voltage at 260 is raised above ground when pMOSFET 220 is ON. Another embodiment may be realized by eliminating pMOSFET 250, grounding node 260, and connecting the substrate well of nMOSFET 220 to a negative voltage so that its threshold voltage is raised. Another embodiment may be realized by raising the threshold voltage of nMOSFET 220 by ion implantation of its channel.

Figure 3:
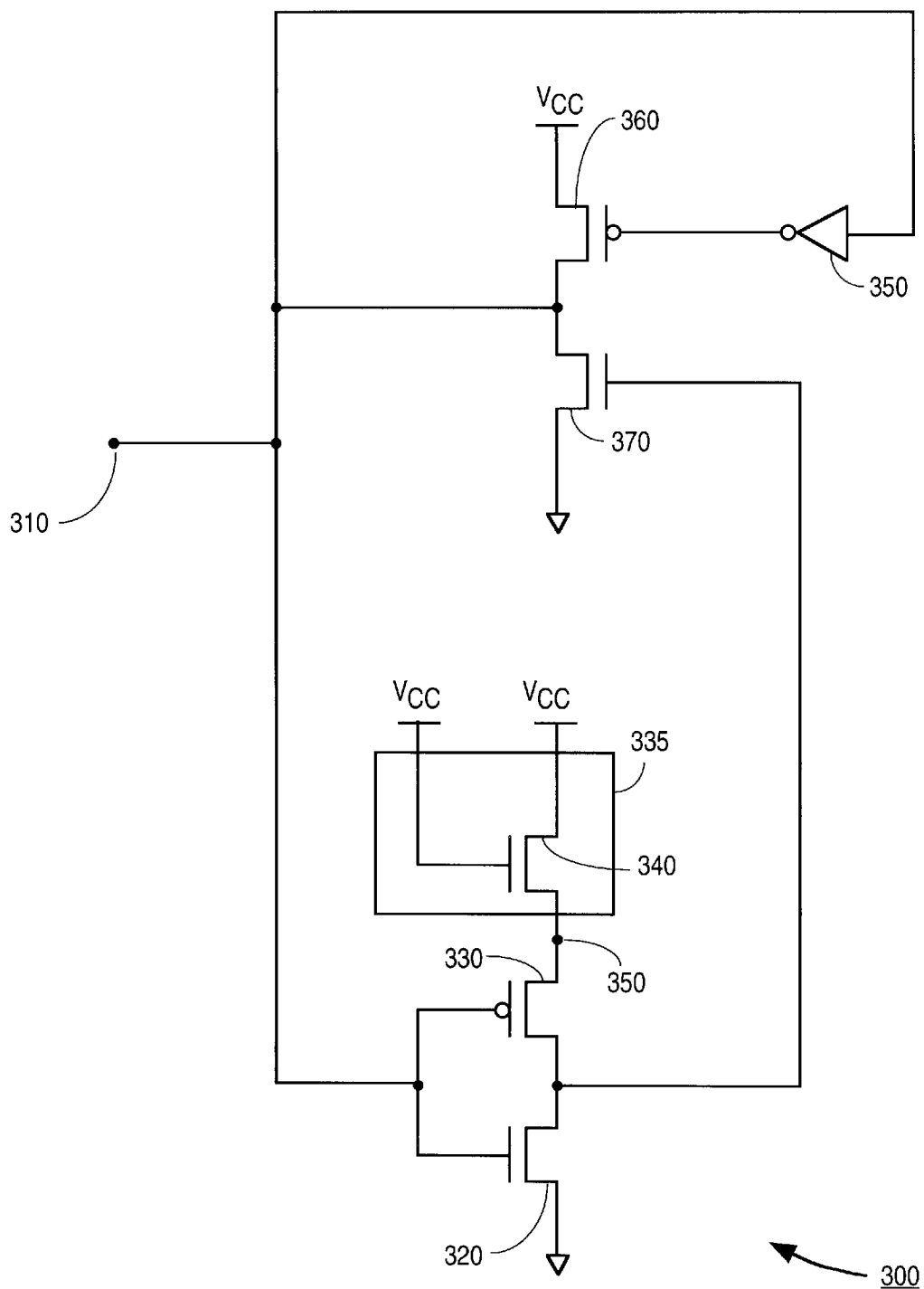
FIG. 3 illustrates a full latch with reduced power dissipation.

Circuit 300 of FIG. 3 illustrates an embodiment for holding or latching a voltage at node 310 when it is HIGH or LOW. That is, circuit 300 provides the function of a full latch or keeper. Node 310 may be connected to additional logic, which is not shown.

Bias circuit 335 is coupled to pMOSFET 330 so as to raise the magnitude of its threshold voltage. In the particular embodiment illustrated in FIG. 3, bias circuit 335 comprises nMOSFET 340 with its gate and drain connected to supply voltage $V_{cc}$ and its source connected to the source of pMOSFET 330. However, as discussed in relation to FIG. 2, other embodiments may be realized to raise the threshold voltage of pMOSFET 330.

Transistor nMOSFET 340 prevents the voltage at node 350 from exceeding $VV_{cc}-V_{be}$ for similar reasons as given for pMOSFET 250 in FIG. 2, where now $V_{be}$ is due to the presence of nMOSFET 340 with its gate voltage and drain voltage at $V_{cc}$. Again, $V_{be}$ may oscillate.

Consider the case in which initially the voltage at node 310 is HIGH, so that CMOS inverter 350 keeps a LOW voltage at the gate of pMOSFET 360 so that it is ON, nMOSFET 320 is ON and pMOSFET 330 is OFF so that the gate voltage at nMOSFET 370 is LOW and nMOSFET 370 is OFF. Now suppose that the voltage at node 310 transitions from HIGH to LOW. There will be crossbar current flowing through pMOSFET 330 and nMOSFET 320 because there will be a nonzero time for which both are ON. However, because the voltage at node 350, which is the source voltage of pMOSFET 330, cannot be greater than $V_{cc}-V_{be}$, pMOSFET 330 will not start to turn ON until the voltage at node 310 falls from HIGH to $V_{cc}-V_{be}-|V_{th}|$(bias), where $V_{th}$ (bias) is now the threshold voltage of pMOSFET 330 when biased. This event takes longer than the event of the voltage at node 310 falling from HIGH to $V_{cc}-|V_{th}|$, where this later event would cause pMOSFET 330 to turn ON if node 350 were at $V_{cc}$. Consequently, the presence of nMOSFET 340 keeping the voltage at node 350 at or below $V_{cc}-V_{be}$ delays the time at which pMOSFET 330 switches ON, and because the time at which nMOSFET 320 switches OFF is not appreciably affected, there is a reduction in the total length of time for which both transistors 320 and 330 are ON. Thus, there is a reduction of the duty cycle for the crossbar current flowing through transistors 320 and 330.

Now consider the case in which the voltage at node 310 is initially LOW, so that pMOSFET 360 is OFF, nMOSFET 320 is OFF, and pMOSFET 330 is ON so that the gate voltage of nMOSFET 370 is HIGH causing nMOSFET 370 to be ON. Suppose that the voltage at node 310 transitions from LOW to HIGH. Again, there will be a nonzero time for which both transistors 320 and 330 are ON because nMOSFET 320 will switch ON before pMOSFET 330 switches OFF. However, pMOSFET will switch OFF when the voltage at node 310 rises from LOW to $V_{cc}-V_{be}-|V_{th}|$(bias), which takes less time than the voltage at node 310 rising from LOW to $V_{cc}-|V_{th}|$, where this later event is required to cause pMOSFET 330 to switch OFF if its source voltage were at $V_{cc}$ instead of $V_{cc}-V_{be}$. Thus, we see that preventing the source voltage of pMOSFET 330 from exceeding $V_{cc}-V_{be}$ reduces the duty cycle of the crossbar current.

Other embodiments than that shown in FIG. 3 may be realized, for example, an embodiment in which node 350 is connected to the supply voltage, and the well of pMOSFET 330 is connected to a voltage greater than the supply voltage $V_{cc}$ so that its threshold voltage is raised. In another embodiment, ion implantation may be applied to the channel of pMOSFET 330 to raise its threshold voltage.

Additional embodiments to those given above may be practiced without departing from the scope of the invention as claimed below.

What is claimed is:

1. A switching circuit to latch a voltage at a node, the switching circuit comprising:
   a power supply circuit to provide a supply voltage;
   a CMOS inverter having an input terminal with a voltage responsive to the node voltage, having an output terminal, and comprising a first pMOSFET;
   a first nMOSFET having a gate with a logic level equal to the logic level of CMOS inverter output terminal;
   a second pMOSFET having a drain connected to the first nMOSFET drain;
   an inverter coupling the second pMOSFET gate to the node to provide at the gate of the second pMOSFET a logic level equal to the complement of the logic level of the node; and
   a bias circuit coupled to the power supply and the source of the first pMOSFET to raise the threshold voltage of the first pMOSFET compared to when the source and substrate of the first pMOSFET are at the supply voltage.

2. The switching circuit as set forth in claim 1, wherein the bias circuit comprises a second nMOSFET having a gate and drain at the supply voltage and its source coupled to the source of the first pMOSFET so that the source voltage of the first pMOSFET is less than the supply voltage when the first pMOSFET is ON.

3. A switching circuit to latch a voltage at a node, the switching circuit comprising:
   a CMOS inverter having an input terminal with a voltage responsive to the node voltage, having an output terminal, and comprising a first pMOSFET;

a nMOSFET having a gate with a logic level equal to the logic level of CMOS inverter output terminal;

a second pMOSFET having a drain connected to the nMOSFET drain;

an inverter coupling the second pMOSFET gate to the node to provide at the second pMOSFET gate a logic level equal to the complement of the logic level of the node; and a bias circuit coupled to the first pMOSFET to bias the source of the first pMOSFET relative to its substrate.

4. A method for latching a voltage at a node, the method comprising the steps of:

coupling the input terminal of a CMOS inverter to the node so that its input terminal voltage is responsive to the node voltage, wherein the CMOS inverter has an output terminal and comprises a first pMOSFET;

coupling a nMOSFET to the CMOS inverter output terminal so as to provide at the gate of the nMOSFET a logic level equal to the logic level of CMOS inverter output terminal;

connecting the drain of a second pMOSFET to the nMOSFET drain;

coupling an inverter to the gate of the second pMOSFET and to the node to provide at the second pMOSFET gate a logic level equal to the complement of the logic level of the node; and implanting ions in the channel of the first pMOSFET to raise its threshold voltage.

* * * * *

UNITED STATES PATENT AND TRADEMARK OFFICE
CERTIFICATE OF CORRECTION

PATENT NO.    : 6,069,512
DATED         : May 30, 2000
INVENTOR(S)   : Rodriguez et al.

Page 1 of 1

It is certified that error appears in the above-identified patent and that said Letters Patent is hereby corrected as shown below:

<u>Column 1,</u>
Line 48, delete "increase switching" and insert -- increase the switching --.

Signed and Sealed this

Fourth Day of February, 2003

JAMES E. ROGAN
*Director of the United States Patent and Trademark Office*